United States Patent [19]
Larsson

[11] Patent Number: 6,157,694
[45] Date of Patent: Dec. 5, 2000

[54] FRACTIONAL FREQUENCY DIVIDER

[75] Inventor: Patrik Larsson, Matawan, N.J.

[73] Assignee: Lucent Technologies, Inc., Murray Hill, N.J.

[21] Appl. No.: 09/208,299

[22] Filed: Dec. 9, 1998

[51] Int. Cl.[7] .................................................. H03K 21/00
[52] U.S. Cl. .............................. 377/48; 377/47; 327/115; 327/117
[58] Field of Search ........................ 377/47, 48; 327/115, 327/117

[56] References Cited

U.S. PATENT DOCUMENTS 5,189,685  2/1993  Jaffard et al. ............................. 377/47
5,982,210  11/1999  Rogers ..................................... 377/47

Primary Examiner—Margaret R. Wambach
Attorney, Agent, or Firm—Henry I. Schanzer

[57] ABSTRACT

In systems embodying the invention X clock signals having the same frequency, with each clock signal having a different phase, are supplied to the inputs of a multiplexer whose output is connected to the input of an "integer" frequency divider circuit; where X is an integer greater than 1. The mulitplexer is controlled to selectively supply different ones of the X clock signals to the frequency divider circuit for producing at the output of the frequency divider circuit a signal whose frequency is a function of the divider ratio of the frequency divider circuit and the sequencing of the clock signals supplied to the frequency divider circuit.

15 Claims, 6 Drawing Sheets

FRACTIONAL FREQUENCY DIVIDER

BACKGROUND OF THE INVENTION

This invention relates to divider circuitry and, in particular, to fractional frequency divider circuitry.

A known prior art scheme for dividing an input clock signal (f1) by a fractional number (e.g., 8.25) includes the application of the clock signal (f1) to a controllable integer divider network. By way of example, if it is desired to divide f1 by 8.25, the controllable divider may be programmed to divide by 8 for three sets of 8 complete clock cycles of f1 and to divide by 9 for one set of 9 complete clock cycles of f1. The result is that the output clock signal (fo) of the controllable divider network will contain four full cycles for every 33 complete clock cycles of the input clock signal f1.

A problem with this prior art scheme is that there is a significant lack of symmetry in the waveshape of the output clock signal (fo) when the 3 output clock cycles produced from the divide by 8 cycles are compared to the clock cycle produced from the divide by 9 cycle. That is, for every 4 cycles of the output clock, 3 cycles will each have a period of 8/f1 and one cycle will have a period of 9/f1. In many applications such as in frequency synthesizers and in clock recovery circuits where reliance is placed on phase detection, the asymmetry in the period of the cycles of the output clock (fo) results in the generation of phase errors, even though the output clock has the desired frequency. This is undesirable since phase errors result in the generation and presence of jitter (which is equivalent to noise) in the signals propagated and processed in the system.

SUMMARY OF THE INVENTION

In circuits embodying the invention, to obtain fractional division, the frequency/phase of the input clock signal applied to a frequency divider network is varied while the divider ratio of the frequency divider network is kept constant. An advantage of performing fractional division in accordance with the invention is that output signals are produced which have a high degree of symmetry relative to each other rendering these output signals suitable for use in systems requiring little jitter.

More specifically, systems embodying the invention include control circuitry responsive to X different clock signals, each having the same frequency (f1) but with a different phase, for coupling and sequencing the application of selected ones of the X clock signals to an integer frequency divider circuit, where X is an integer greater than 1. The control circuit is programmed to select and apply different ones of the X clock signals to the frequency divider circuit such that the frequency divider produces an output clock signal whose frequency is a function of the divider ratio of the frequency divider and the sequencing of the X different clock signals to the frequency divider. This is in contrast to the prior art where, to obtain fractional division of a clock signal, a constant frequency input clock signal is applied to the input of a frequency divider network whose divider ratio is varied to produce fractional division.

The control circuit may include a multiplexer having an input port for receiving the X clock signals and having an output port to which is selectively coupled one of the X clock signals for application to the input of the frequency divider circuit.

The control circuit may also include circuitry for producing a control signal and for applying the control signal to the multiplexer for controlling the sequence of the X clock signals applied to the frequency divider circuit. By appropriate selection of the sequencing of the X clock signals applied to a divide-by-N circuit, where N is an integer equal to or greater than one, the frequency (fo) at the output of the divider may be made equal to f1/[N+(K/X)]; where f1 is the frequency of the X different clock signals; and where K may be any integer ranging between X and (X−1).

The control circuitry may also include circuitry coupled to the frequency divider circuit for supplying control signals to it and for controlling its divider ratio.

Applicant's invention also resides in a method for producing a fractional division of a clock signal in a system in which there are X clock signals having the same frequency (f1) with each of the X clock signals having a different phases, where X is an integer greater than one (1), and wherein the invention comprises the steps of selectively selecting different ones of the X clock signals and applying the selected one of the X clock signals to a divide-by-N network for producing at the output of the divide-by-N network an output frequency signal (fo) whose frequency is a function of the divide ratio of the divide-by-N network and the sequencing of the selected clock signals applied to the divider network.

In a particular embodiment each one of the X clock signals of frequency (f1) is designed such that the phase spacing (i.e., time delay) between the adjacent clock signals is made substantially the same.

In a particular embodiment the step of selectively selecting different ones of the X clock signals and applying the selected one of the X clock signals to a divide-by-N network includes the steps of applying the X clock signals to an input port of a multiplexer and controlling the multiplexer for successively coupling and sequencing different ones of the X clock signals to an output port of the multiplexer for producing a composite signal and then applying the composite signal at the output of the multiplexer to the divide-by-N network.

BRIEF DESCRIPTION OF THE DRAWINGS

In the accompanying drawings like reference characters denote like components.

DETAILED DESCRIPTION OF THE INVENTION

Figure 1:
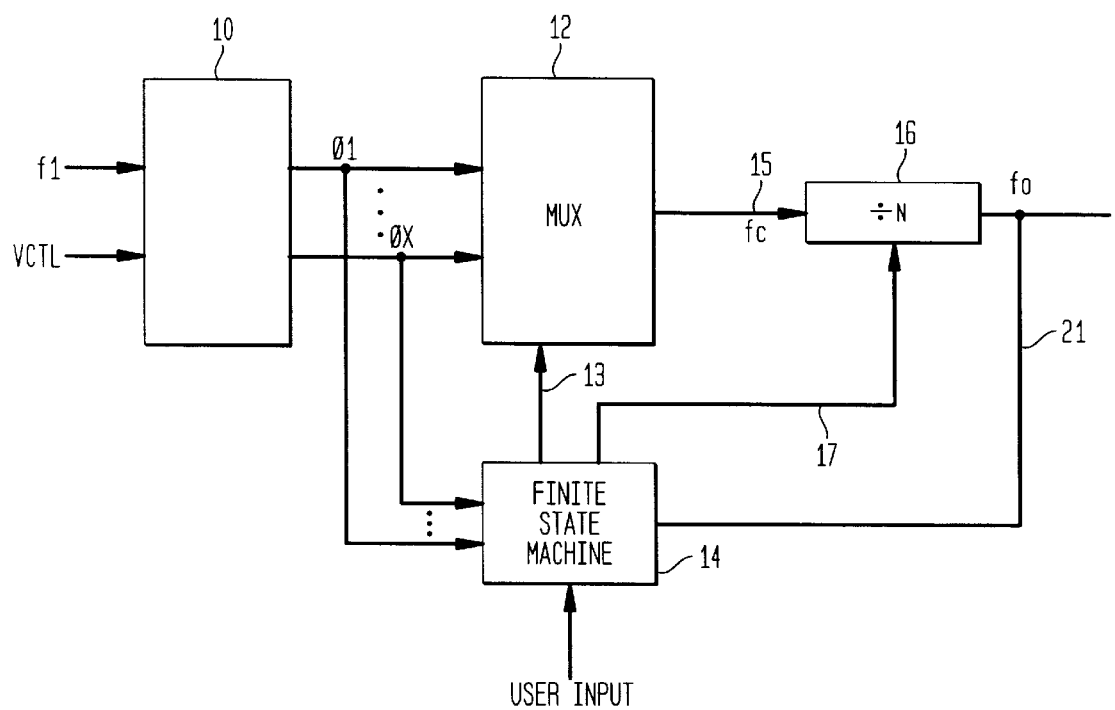
FIG. 1 is a block diagram of a fractional divider circuit embodying the invention.
Figure 1A:
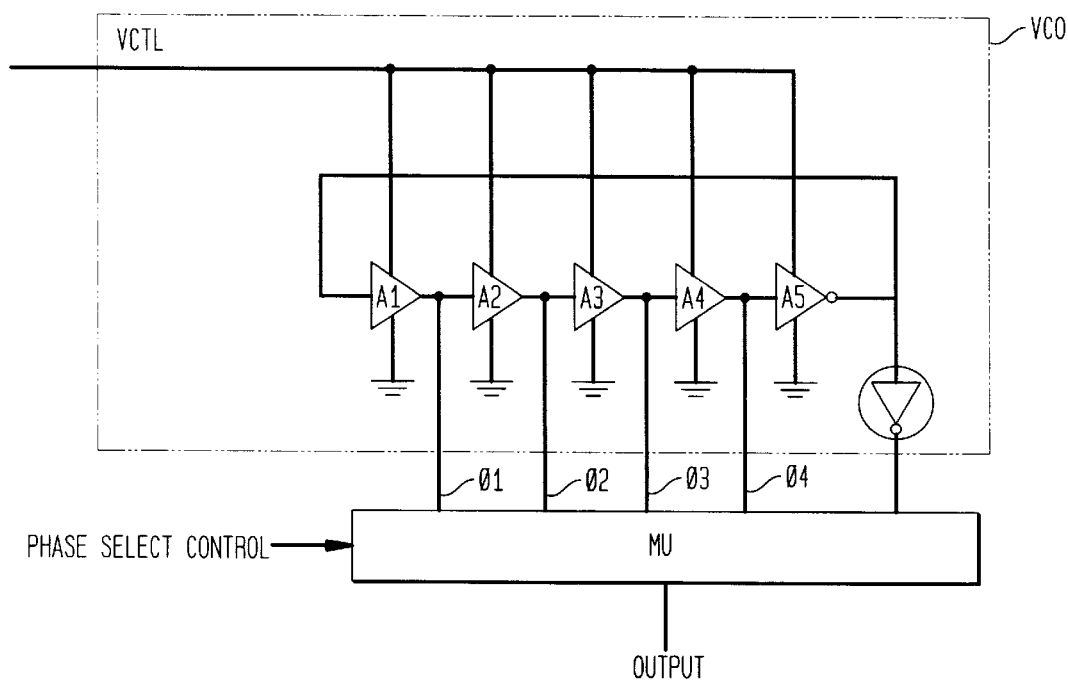
FIGS. 1A & 1B are simplified block diagram representations of sources of clock signals suitable for use in the circuit of FIG. 1.
Figure 1B:
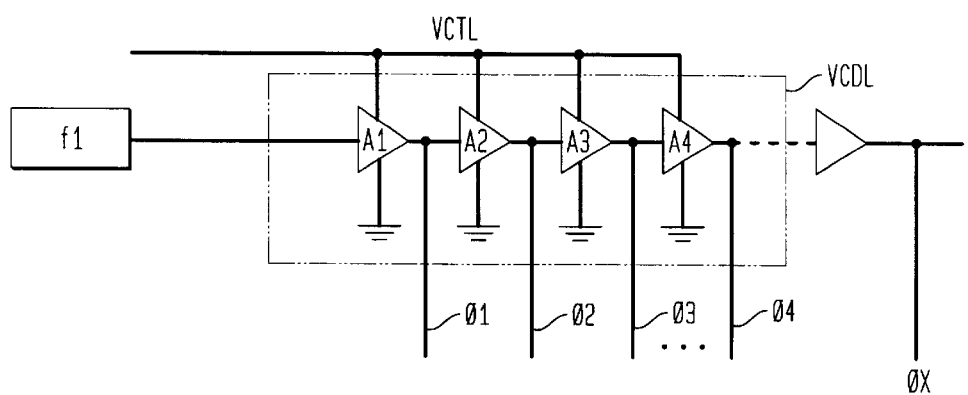

In circuits embodying the invention fractional division is accomplished by applying different clock signals having the same frequency, but different phases, to an "integer" divider network. The invention will now be discussed with reference to FIGS. 1 and 2. FIG. 1 shows a clock generator 10 for producing a number X of different clock signals (φ1 through φX), where the X different clock signals have the same frequency but different phases. The clock generator 10 may be, for example, a voltage controlled oscillator (VCO) as shown in FIG. 1A or a voltage controlled delay line (VCDL) as shown in FIG. 1B. In the case of the VCO shown in FIG. 1A, the number of amplifying stages (A1–A5) in the VCO loop and a control voltage (VCTL) applied across the amplifying stages of the VCO determine the of oscillation of the VCO. Where the amplifying stages are the same, the phase spacing between adjacent phases will be the same. In the case of the VCDL of FIG. 1B, a reference frequency, fref, is propagated along an amplifying chain with the delay of each stage determining the phasal relationship of the various clock signals. Alternatively, the clock generator 10 may be any source of clock signal capable of producing a desired number of different clock signals having the same frequency with different phases.

The X clock signals from the clock generator are supplied to a multiplexer (MUX) 12, whose response is controlled by a finite state machine (FSM) 14. The MUX 12 may be any suitable multiplexing or logic device having an input port capable of receiving the X clock signals and which, in response to a control signal, couples a selected one of MUX input clock signals at a time, to a common output.

The finite state machine 14 may be any suitable microprocessor or controller circuit which is either programmable or preprogrammed or responsive to user control. In response to signals from FSM 14, supplied to the MUX 12 via line 13, the MUX 12 functions to provide a selected one of the X clock signals onto an output line 15 which is connected to the input of a controllable frequency divider circuit (or counter) 16.

Frequency divider 16 may be any divider or counter circuit whose divider ratio "N" may be set to, or settable to, any number (N) equal to or greater than one and which will produce one output cycle (fo) for every "N" fill input cycles applied to its input. In FIG. 1, the frequency divider ratio "N" of divider 16 may be also controlled by FSM 14 by supplying signals via line 17 connected between FSM 14 and divider 16. The output fo of divider 17 may be fed back via line 21 to FSM 14 so that the number of times the output fo switches, and the nature of each transition (e.g., high-to-low and low-to-high) are inputted to appropriate circuits in FSM 14. For reasons to be discussed below, the X different clock signals also may be supplied to the FSM 14.

Under the control of FSM 14, the combination of MUX 12 and divider 16 produces a "fractional" division of input clock signals. As detailed below, the MUX 12 is used to control the sequencing of the different input clock signals (e.g., φ1, φ2, φ3 and φ4) to produce a composite signal (fc) at its output which is supplied via line 15 to the input of a divide-by-N network 16 which divides by whole integers. However, due to the nature of the composite signal supplied to the divider network 16, the output signal (fo) of the divider will be a non-integer fractional ratio of the input clock signals. An example of the operation of the system of FIG. 1 whereby division by a "fractional" number (i.e., a number other than an integer) is accomplished is as follows.

Figure 2:
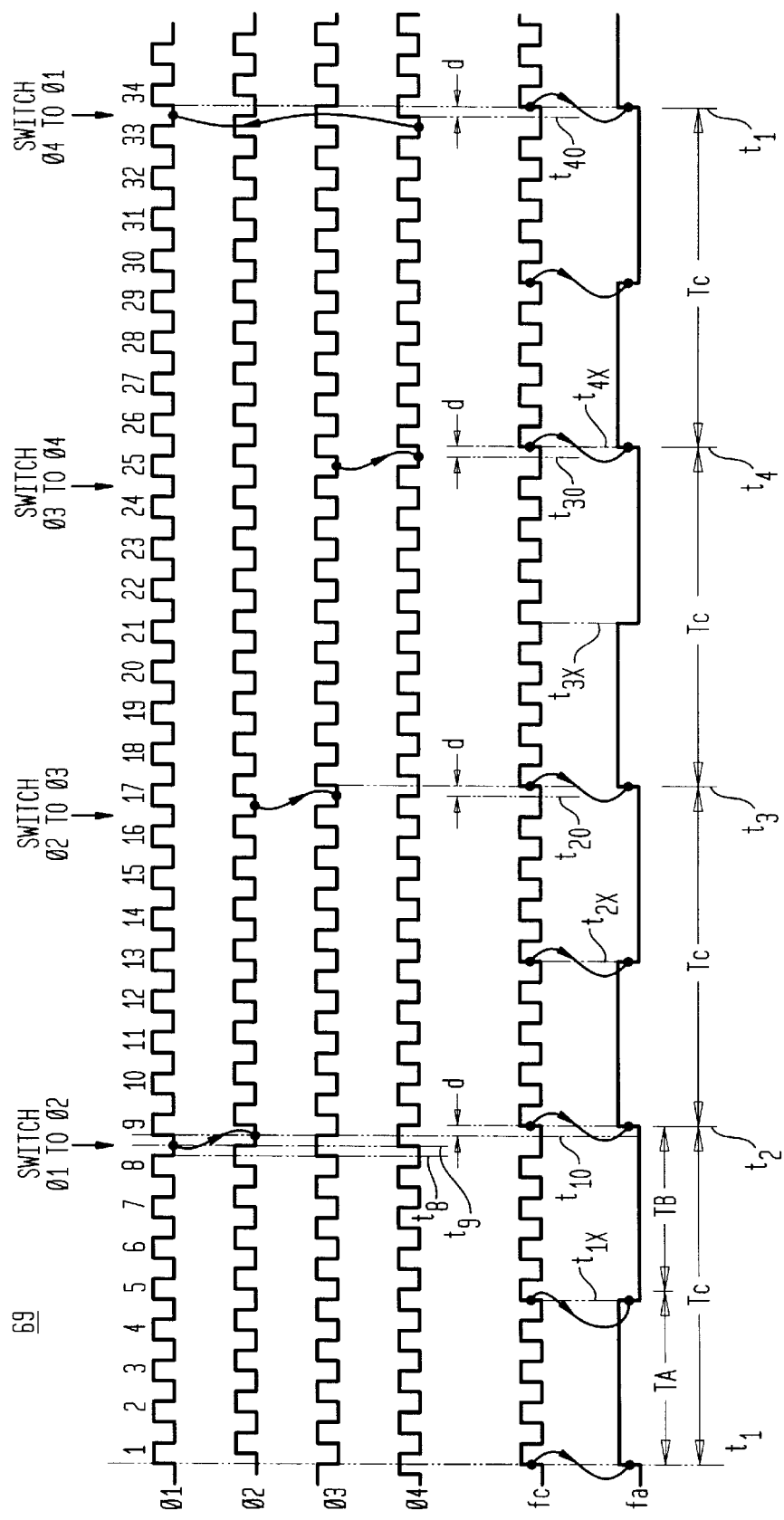
FIG. 2 is a waveform diagram of clock signals for operating the circuit of FIG. 1 and of clock signals generated in the circuit of FIG. 1.

For purpose of illustration assume that the system of FIG. 1 is required to divide by 8.25; i.e., fo is to be made equal to f1/8.25. To provide the fractional division factor of 0.25 (i.e., ¼) the clock generator 10 is designed or programmed to produce 4 different clock signals. Therefore, assume as shown in FIG. 2 that the clock generator 10 produces 4 input clock signals, φ1, φ2, φ3, φ4, (i.e., X is equal to 4) having the same frequency (f1), with the different clock signals being generated such that each clock signal (phase) is offset from its two adjacent clock signals by an equal time delay or phase spacing. For this example, each one of the 4 input clock signals is spaced by ¼ of a cycle of f1 from its adjacent clocks, as shown in FIG. 2. The 4 clock signals are then supplied to MUX 12 which produces a composite signal fc at its output. The production of the composite signal fc and its application to the counter 16 will now be detailed to demonstrate how the circuit performs fractional division.

1—To produce a first output of the counter 16, from time t1 to time t2, as shown in FIG. 2, assume that the MUX 12 is controlled to couple φ1 onto line 15 for 8 clock cycles of φ1. Assume also that FSM 14 includes a detector to sense the transitions of the clock signals and a counter to count the 8 low-to-high transitions of φ1. After the 8$^{th}$ low-to-high transition of φ1 is counted by FSM 14 and then after FSM 14 senses that φ1 goes from high to low (at time t8 in FIG. 2) and φ2 goes from high to low (at time t9 in FIG. 2), FSM 14 supplies a signal to MUX 12 to cause the clock signal supplied on line 15 to be switched from φ1 to φ2. Thus at a time identified as t10 in FIG. 2 (before φ1 makes a 9$^{th}$ low-to-high transition), the signal on line 15 is switched from φ1 to φ2.

Figure 3:
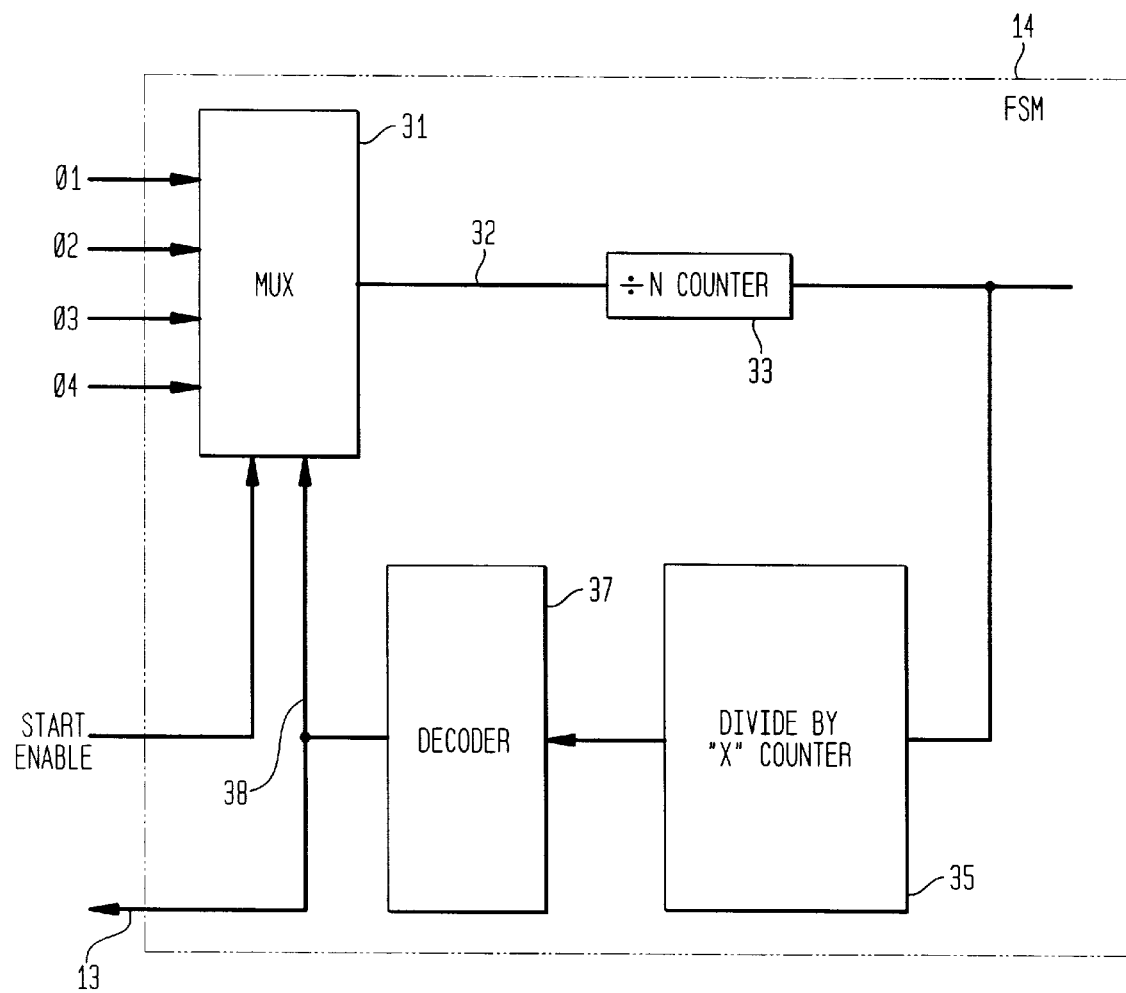
FIG. 3 is a simplified diagram of circuitry for use in the system of FIG. 1.

Note that the counting and sequencing of the clock signals may be readily implemented as shown, for example, in FIG. 3. A multiplexer 31 in FSM 14 is responsive to the clock signals φ1 through φX. For purpose of illustration, X is shown to be 4. Upon receipt of a start enable signal, one of the clock signals (e.g., φ1) is supplied onto line 32 for application to a divide-by-N counter 33. The counter 33 is settable to any integer equal to or greater than one (1). Counter 33 counts N transitions (e.g., low-to-high transitions) of the present clock signal (e.g., φ1). After it has counted N pulses, counter 33 produces an output pulse and resets to zero. The output pulse from counter 33 is supplied as an input to counter 35 which counts up to X. In this example, up to 4. The output of counter 35 is decoded via decoder 37 which supplies control signals via line 38 to MUX 31. After the 8$^{th}$ count of the present clock (e.g., φ1), counter 35 is advanced by one count, which is decoded and then applied to MUX 31 to select the application of the next set of pulses from the nest clock pulse (e.g., φ2) onto line 32. Note that counter 16 in FIG. 1 may be used instead of counter 33, thereby eliminating the need for this additional counter. The counting and sequencing of the clock signals may be implemented in several different ways and need not be further detailed.

As is evident from an examination of FIG. 2, at time t10, switching from clock φ1 to clock φ2 causes a delay "d" in the low-to-high transition of the composite signal fc applied to the divider circuit 16. The delay "d" in FIG. 2 is equal to one-quarter (¼) of the period of the input clock signals, with each one of the 4 clock signals being spaced (delayed) by a like amount "d" relative to its adjacent clock signals. Assume that the divide-by-N counter 16 is set to divide by a whole integer (e.g., 8) such that for 8 full cycles of its input clock it will produce one (1) output cycle. The operation of divide-by-N circuits (or counters) is known and need not be detailed. However, for purpose of illustration, assume that, at time t1 in response to the φ1 clock going from low-to-high, the counter output (fo) also goes from low-to-high. After counting 4 full cycles of the clock signal fc applied to its input, the counter output, fo, goes from high to low at a time indicated as t1x in FIG. 2. That is, the output of counter 16 changes state after every 4 full clock cycles of the composite clock signal fc sensed by counter 16. Thus when the counter 16 senses the 8$^{th}$ full cycle of the fc clock at time t2, the output of the counter 16 makes a transition from low to high completing one full output cycle after 8.25 cycles of φ1 and effectively dividing the input clock signals by 8.25, which is a fractional number. [Note: In FIG. 2 and in the discussion above, the switching from φ1 to φ2 is shown to occur between the $8^{th}$ and $9^{th}$ pulse. However, the switching from φ1 to φ2 can be programmed to occur at any time after the first full cycle of φ1. Also, in FIG. 2 and in the discussion above, the switching from φ1 to φ2 has been illustrated as occurring between the $8^{th}$ and $9^{th}$ cycle of φ1. That is, the MUX is controlled to cause its output to switch from the presently selected phase to the next phase after the $8^{th}$ count. In practice, switching from the presently selected clock to the next clock could, or would, be made to occur earlier in the period to ensure proper completion of the "division" before the end of the cycle. This is also applicable to all the switching sequences described below.]

2—To produce a second output cycle at the output of the counter 16, as shown for time t2 to t3 in FIG. 2, assume that (as above) the MUX 12 is now controlled to couple φ2 onto line 15 for 8 clock cycles of φ2. Assume also that, beginning at time t2, FSM 14 detects the 8 low-to-high transitions of φ2. After the $8^{th}$ low-to-high transition of φ2 is sensed by FSM and then after FSM 14 senses that φ2 subsequently goes from high-to-low and that φ3 goes from high-to-low, FSM 14 supplies a signal to MUX 12 to switch the clock signal supplied on line 15 from φ2 to φ3. As discussed above, switching from φ2 to φ3 causes the low-to-high transition of the composite signal fc to be delayed by a delay "d", which is equal to the phase spacing (delay) between φ2 and φ3. Note that the composite signal, fc, is now delayed by 2d relative to φ1 or to an external reference clock signal f1. The net effect of the shift is to again produce an output clock signal which is equal to f1/8.25. It is also clear that the period Tc between t2 and t3 is equal to Tc between t1 and t2.

3—To produce a third output cycle at the output for the counter 16, assume that MUX 12 is controlled to couple φ3 onto line 15 for 8 clock cycles of φ3. As before, the clock φ3 is supplied to FSM 14 to count the next 8 low-to-high transitions of φ3. After the $8^{th}$ count and after φ3 goes from high to low and φ4 goes from high to low, FSM 14 supplies a signal to MUX 12 to switch the clock signal supplied on line 15 from φ3 to φ4. As before, switching from φ3 to φ4 causes the low-to-high transition of the composite signal fc to be delayed by a delay "d", which is equal to the phase spacing (delay) between φ3 and φ4. Note that the composite signal is now delayed by three times the delay "d relative to φ1 or to an external reference clock signal f1. The net effect of the shift is to again produce an output clock cycle which is equal to f1/8.25 and whose period Tc is equal to that of the first and second output clock cycles.

4—To produce a fourth output cycle at the output of the counter 16, as shown for time t4 to t11 in FIG. 2, assume that the MUX 12 is now controlled to couple φ4 onto line 15 for 8 clock cycles of φ4. As before, the clock φ4 is supplied to FSM 14 to count the 8 low to high transitions of φ4. After the $8^{th}$ low to high transition of φ4 has been counted and, subsequently, after φ4 goes from high to low and φ1 goes from high to low, FSM 14 supplies a signal to MUX 12 to switch the clock signal supplied on line 15 from φ4 to φ1. As is shown in FIG. 2, switching from φ4 to φ1 causes the low-to-high transition of the composite signal fc to be delayed by an additional delay "d", relative to φ4. The composite signal fc then makes its transition at a time indicated as t11 in FIG. 2.

In general, the net effect of the selective sequencing of the different clock signals is that a composite signal fc has been produced which when supplied to an "integer" divider network results in the "fractional" division of the input clock signal.

As a result of switching the phases of the clock signal supplied to the divider 16, 4 full cycles are produced at the output of the divider circuit 16 every 33 full cycles of φ1, whereby fo is equal to f1/8.25; where f1 is the frequency of the input clock signals φ1, φ2, φ3, and φ4.

In FIG. 2, there was illustrated fractional division by of 8.25 resulting from effectively adding a fraction K/X to a whole number N (i.e., N=8), where K was equal to 1 and X was equal to 4. To accomplish this fractional division after (and/or during) each count of N cycles, the multiplexer was controlled to sequentially advance the input clock signals by one (1) phase space at a time (φ1 to φ2 to φ3 to φ4 and then back to φ1, and so on). It should be appreciated that the input clock signals φ1, φ2, φ3 to the multiplexer ay be sequenced in a variety of ways to produce fractional numbers of K/X., where K may be any integer ranging from 1 to (X−1). Thus, for the example where there are four input clock signals (φ1, φ2, φ3, φ4), with each one of the four clock signals being equally spaced from its adjacent clocks, fractional division of 0.5 or 0.75 may also be produced by controlling the sequencing of the clock signals applied to the input of a divide-by-N circuit.

Where the number of clock signals (e.g., X) having the same frequency f1 are arranged to have equal phase spacing between adjacent ones of the X clock signals and, where the X clock signals are sequenced in a predetermined order (as shown in FIG. 2 and discussed above) and where the sequenced (or composite) signal is supplied to a divider network having a divider ratio of "N", the frequency (fo) at the output of the divider network may be expressed as:

$$fo=f1/[N+(K/X)] \qquad \text{eq. 1}$$

where K is an integer which may range in value from 1 to (X−1).

In the case of dividing by 8.25 described above, K=1 and the phase sequencing is φ1 to φ2 to φ3 to φ4 then back to φ1and so one; i.e., the phase jump is one phase space at a time in each complete set of N cycles of f1. This is represented in eq. 1 by setting N=8, K=1, and X=4. In the case of dividing by 8.5, K=2 and the phase sequencing every N cycles will be from φ1 to φ3 then to φ1 to and then to φ3, and so on. The phase jump will be equal to two phase spacing (K=2) for every set of N cycles to produce a fractional division of 8.5. Likewise in the case of dividing by 8.75, K=3 and the phase sequencing every N cycles will be φ1 to φ4 to φ3 to φ2 to φ1, back to φ4, and so on.

The divider ratio 37 N" may be varied over a broad range, as is well known. In addition, X may be varied, for example, by increasing and or decreasing the number of stages in the VCO loop of FIG. 1A or in the VCDL loop of FIG. 1B, or in any other suitable manner. Likewise, the factor K may be varied by including circuitry in FSM 14 which can be set or controlled to determine the sequencing of the different clock signals (φ1 through φx) outputted from the multiplexer and applied to the input of the divider network, or by programming FSM 14, or by automatic and/or feedback controls.

Figure 4:
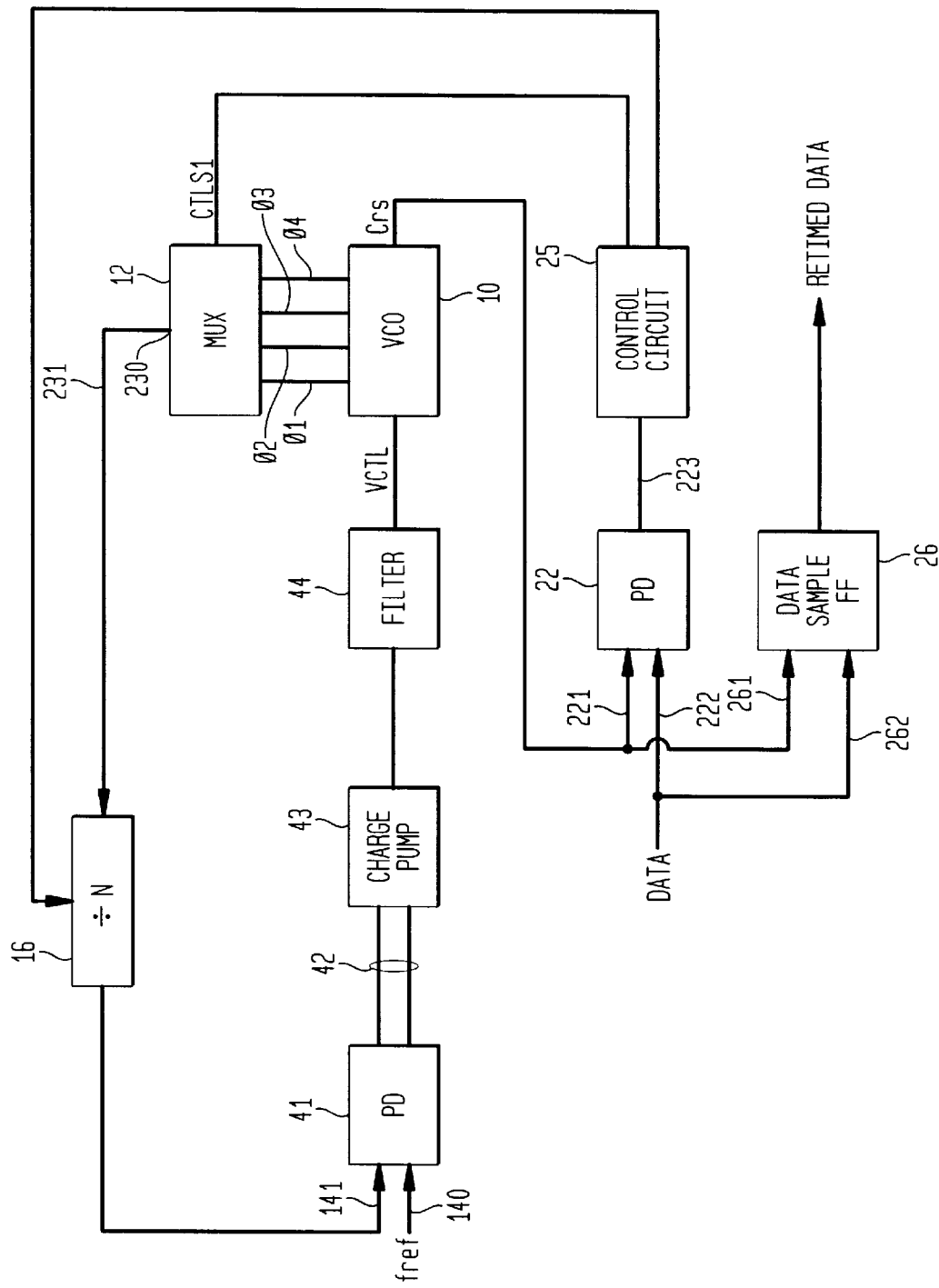
FIG. 4 is a block diagram of a clock recovery system embodying the invention.
Figure 5:
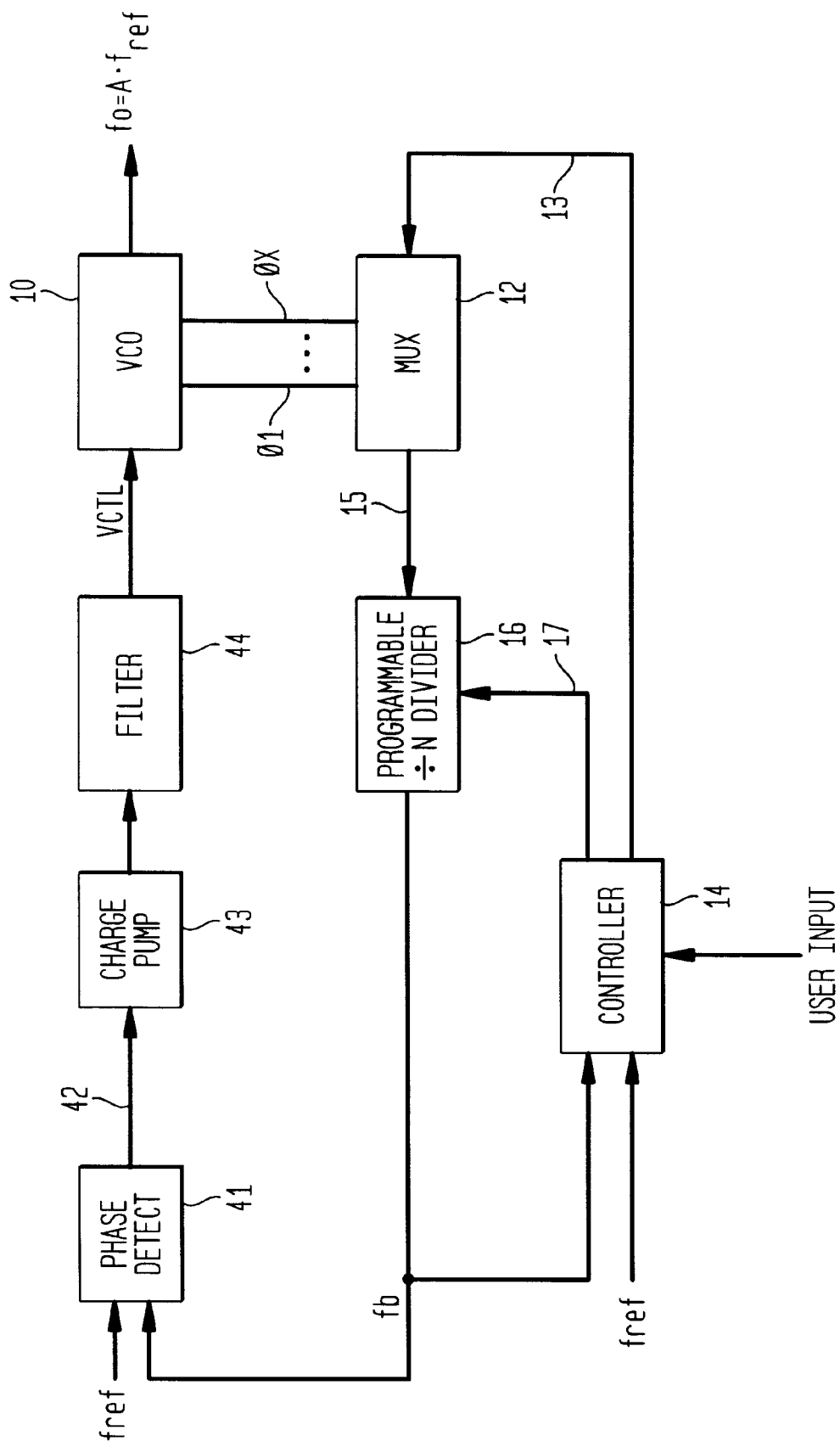
FIG. 5 is a block diagram of a frequency synthesizer system embodying the invention.

It should be noted that, in accordance with the invention, the periods of each cycle of the output clock (fo) are the same. [The two halves of each cycle are not symmetrical, but all the cycles are symmetrical with respect to each other.] An advantage of producing an output clock of this type is that there is zero phase error in the selected edge (e.g., low-to-high) transition of the fo clock. It is highly beneficial to incorporate the invention in systems where very little jitter is desired. This includes, for example, clock recovery systems, as shown in FIG. 4, and frequency synthesizer systems, as shown in FIG. 5, and as more extensively described in my co-pending application titled DIGITAL PHASE SELECTION AND METHOD FOR REDUCING JITTER bearing Ser. No. 09/208,523 and assigned to the same assignee as this application and whose teachings are incorporated herein by reference. In the clock recovery system shown in FIG. 4, a divide-by-N network 16 is connected in the feedback path between the output 230 of a multiplexer, MUX 12, and the input 141 of a phase detector 41. The phase detector 41 has a second input (140) to which is applied a reference signal and which produces an error signal at its output 42 which controls a charge pump 43 whose output is supplied to a filter 44 to develop a control voltage (VCTL) supplied to a VCO 10 which produces a preselected number of clock signals ($\phi1$, $\phi2$, $\phi3$ and $\phi4$) which are supplied to the input port of a multiplexer 12. The sequencing of the multiplexer 10 is controlled via a control signal CTLS 1 and the divider ration "N" of divider circuit 16 is controlled by a control signal CTLS 2. CTLS 1 and CTLS 2 are produced by a data recovery circuit which includes comparing the frequency and phase of a data stream with one of the clock signals (crs) produced by VCO 10 using a phase detector 22 whose output 223 is supplied to control circuit 25 which generates signal CTLS1 and CTLS2. One of the VCO generated clock signals (crs) is then applied together with the data stream to a data sample flip flop (FF) 26 to produce the retimed data for use in the system. Insertion of a divide-by-N network in the feedback path enables the clock recovery circuit to produce a clock signal which may be made to range between (N)(fref) and a fractional number [N+(1/X)]fref; where X is the number of clock signals produced by VCO 10, and K is an integer which may range from 1 to (X−1). Thus, feeding the output of the MUX 12 to divide-by-N network 16 also enables fractional division with very little jitter, as described above. Also, the control circuit 25a may be used to control and alter the divider ratio "N" of the divider network 16. This enables a wide ranging fractional division to be performed with little jitter.

In the frequency synthesizer system of FIG. 5, the divide-by-N circuit 16 is shown to be programmable and controllable by means of a controller 14. The controller 14 may be a finite state machine used to sequence the MUX 12. The output of MUX 12 is supplied to the input of a programmable divider 16 having a divider ratio "N" which may be controlled and varied. The output fb of the programmable divider 16 is fed to an input of a phase detector 41. In FIG. 5, a reference signal is applied to another input of phase detector 41 to control the phase locked loop (PLL) which includes charge pump 43, filter 44 and VCO 10. In the circuit of FIG. 5, fref and/or the output fb are inputted to the controller 14 to provide various timing signals. A user input signal may also be applied to controller 14 to control operation of the circuit. As discussed above, the sequencing of MUX 12 enables the various clock signals ($\phi1$ through $\phi x$ and fo) produced by VCO to be made to range between fo=N(fref) to fo=[N+(K/X)]fref.

What is claimed is:

1. Apparatus comprising:
    a source of clock signals for producing X clock signals having the same frequency (f1) with each clock signal having a different phase; where X is an integer greater than 1;
    a frequency divider circuit having an input and an output;
    a multiplexer having an input port for receiving said X clock signals and having an output port for selectively coupling one of said X clock signals to said output port; and wherein the output port of the multiplexer is connected to the input of said frequency divider circuit;
    a selection circuit coupled to said source of clock signals and to the output of said frequency divider, said selection circuit being responsive to said X clock signals and to said output of said frequency divider circuit for producing a control signal and for applying the control signal to the multiplexer for controlling the sequence of the clock signals applied to the input of the frequency divider circuit, the selection circuit for selectively supplying a different one of said X clock signals to said frequency divider circuit and for producing at the output of the frequency divider circuit a signal whose frequency is a function of the divider ratio of the frequency divider circuit and the sequencing of the clock signals supplied to the frequency divider circuit.

2. Apparatus as claimed in claim 1 wherein said selection circuit also includes circuitry for controlling the divider ratio of the frequency divider.

3. Apparatus as claimed in claim 2 wherein the frequency divider circuit is a programmable divider circuit and the control circuit is coupled to the frequency divider to supply control signals to it for controlling the divider ratio.

4. Apparatus as claimed in claim 1 wherein said source of clock signals is a voltage controlled oscillator (VCO).

5. Apparatus as claimed in claim 4 wherein said VCO includes a number of stages with the propagation delay of each stage being substantially equal.

6. Apparatus as claimed in claim 1 wherein said source of clock signals is a voltage controlled delay line (VCDL).

7. Apparatus as claimed in claim 1 wherein the application of the X clock signals to the frequency divider circuit are controlled to produce an output signal (fo) at the output of the frequency divider whose frequency is equal to [f1]/[N+(K/X)]; where f1 is the frequency of each one the clock signals and N is the divider ratio of the frequency divider circuit, and K may be any integer from 1 to (X−1).

8. Apparatus as claimed in claim 7 wherein each one of the X clock signals has a phase spacing relative to its adjacent clock signals which is equal to f1/X.

9. Apparatus comprising:
    a source of clock signals for producing X clock signals having the same frequency (f1) with each clock signal having a different phase; where X is an integer greater than 1;
    a frequency divider circuit;
    a selection circuit coupled between said source of clock signals and said frequency divider circuit for selectively supplying a different one of said X clock signals to said frequency divider circuit;
    wherein said selection circuit includes a multiplexer having an input port for receiving said X clock signals and having an output port for selectively coupling one of said X clock signals to said output port; and wherein the output port of the multiplexer is connected to an input of said frequency divider circuit;
    said selection circuit including circuitry for producing a control signal and for applying the control signal to the multiplexer for controlling the sequence of the clock signals applied to the frequency divider circuit;
    said selection circuit also including circuitry for controlling the divider ratio of the frequency divider; and
    wherein the frequency divider circuit is a programmable divider circuit and the selection circuit is coupled to the frequency divider to supply control signals to it for controlling the divider ratio.

10. Apparatus comprising:

a source of clock signals including a voltage controlled oscillator (VCO) for producing X clock signals having the same frequency (f1) with each clock signal having a different phase; where X is an integer greater than 1;

a frequency divider circuit;

a selection circuit coupled between said source of clock signals and said frequency divider circuit for selectively supplying a different one of said X clock signals to said frequency divider circuit; and wherein said selection circuit includes a multiplexer having an input port for receiving said X clock signals and having an output port for selectively coupling one of said X clock signals to said output port; and wherein the output port of the multiplexer is connected to an input of said frequency divider circuit.

11. Apparatus as claimed in claim 10 wherein said VCO includes a number of stages with the propagation delay of each stage being substantially equal.

12. Apparatus comprising:

a source of clock signals including a voltage controlled delay line (VCDL) for producing X clock signals having the same frequency (f1) with each clock signal having a different phase; where X is an integer greater than 1;

a frequency divider circuit;

a selection circuit coupled between said source of clock signals and said frequency divider circuit for selectively supplying a different one of said X clock signals to said frequency divider circuit; and wherein said selection circuit includes a multiplexer having an input port for receiving said X clock signals and having an output port for selectively coupling one of said X clock signals to said output port; and wherein the output port of the multiplexer is connected to an input of said frequency divider circuit.

13. Apparatus comprising:

a source of clock signals for producing X clock signals having the same frequency (f1) with each clock signal having a different phase; where X is an integer greater than 1;

a frequency divider circuit;

a selection circuit coupled between said source of clock signals and said frequency divider circuit for selectively supplying a different one of said X clock signals to said frequency divider circuit;

wherein said selection circuit coupled between said source of clock signals and a frequency divider circuit for selectively supplying a different one of said X clock signals to said frequency divider circuit is for producing at the output of the frequency divider circuit a signal whose frequency is a function of the divider ratio of the frequency divider circuit and the sequencing of the clock signals supplied to the frequency divider circuit; and wherein the application of the X clock signals to the frequency divider circuit are controlled to produce an output signal (fo) at the output of the frequency divider whose frequency is equal to $[f1]/[N+(K/X)]$; where f1 is the frequency of each one the clock signals and N is the divider ratio of the frequency divider circuit, and K may be any integer from 1 to (X−1).

14. Apparatus as claimed in claim 13 wherein each one of the X clock signals has a phase spacing relative to its adjacent clock signals which is equal to f1/X.

15. A method for producing a fractional division of a clock signal in a system in which a voltage controlled oscillator (VCO) produces X clock signals having the same frequency (f) but with different phases, where X is an integer greater than one (1), comprising the steps of:

selectively selecting different ones of said X clock signals and applying the selected one of the X clock signals to a divide-by-N network for producing at its output an output frequency signal whose frequency is a function of the divide ratio of the divide-by-N network and the sequencing of the selected clock signals applied to the divider network;

wherein the step of producing X clock signals having the same frequency (fo) but with different phases includes the step of producing these X clock signals with equal spacing between adjacent clock signals;

wherein the step of producing X clock signals having the same frequency (fo) but with different phases includes the step of producing these X clock signals with substantially equal time delays between at least one of the rising and falling edges of adjacent clock signals; and wherein the step of selectively selecting different ones of said X clock signals and applying the selected one of the X clock signals to a divide-by-N network includes the steps of applying the X clock signals to an input port of a multiplexer and controlling the multiplexer for successively coupling different adjacent ones of the X clock signals to an output port of the multiplexer and then applying the output of the multiplexer to the divide-by-N network.

* * * * *